US011757271B2

(12) United States Patent
Akiba

(10) Patent No.: US 11,757,271 B2
(45) Date of Patent: Sep. 12, 2023

(54) ELECTRICAL CONNECTION BOX

(71) Applicant: SUMITOMO WIRING SYSTEMS, LTD., Mie (JP)

(72) Inventor: Kosuke Akiba, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 400 days.

(21) Appl. No.: 17/059,234

(22) PCT Filed: Apr. 2, 2019

(86) PCT No.: PCT/JP2019/014696
§ 371 (c)(1),
(2) Date: Nov. 26, 2020

(87) PCT Pub. No.: WO2019/239685
PCT Pub. Date: Dec. 19, 2019

(65) Prior Publication Data
US 2021/0203144 A1  Jul. 1, 2021

(30) Foreign Application Priority Data

Jun. 11, 2018  (JP) ................................. 2018-111304

(51) Int. Cl.
H02G 3/14  (2006.01)
B60R 16/02  (2006.01)
(Continued)

(52) U.S. Cl.
CPC .......... *H02G 3/14* (2013.01); *B60R 16/0238* (2013.01); *H02G 3/088* (2013.01); *H02G 3/16* (2013.01); *H05K 7/2039* (2013.01)

(58) Field of Classification Search
CPC .. H02G 3/14; H02G 3/16; H02G 3/08; H02G 3/088; H05K 5/00; H05K 5/02;
(Continued)

(56) References Cited

U.S. PATENT DOCUMENTS 6,570,088 B1 * 5/2003 Depp .................. B60R 16/0238
174/59
8,471,145 B2 * 6/2013 Suzuki .................... H02S 40/34
174/67
(Continued)

FOREIGN PATENT DOCUMENTS

JP  H03-235610 A  10/1991
JP  H05-041332 U  6/1993
(Continued)

OTHER PUBLICATIONS

International Search Report dated Jun. 4, 2019 for WO 2019/239685 A1 (2 pages).

*Primary Examiner* — Angel R Estrada
(74) *Attorney, Agent, or Firm* — Venjuris, P.C.

(57) ABSTRACT

Provided is an electrical connection box that includes: a box main body having one surface on which a plurality of component mounting portions in which electrical components are to be mounted are provided; a cover member covering the one surface of the box main body; a lock mechanism including a locked portion provided on a peripheral wall portion of the box main body and an elastic lock portion provided in a cantilever shape on the cover member. The top wall portion of the cover member is made of a resin material with a greater thermal conductivity than the elastic lock portion provided on the peripheral wall portion of the cover member, whereas the elastic lock portion provided on the peripheral wall portion of the cover member is made of a resin material with a greater elasticity than the top wall portion of the cover member.

4 Claims, 4 Drawing Sheets

(51) Int. Cl.
*B60R 16/023* (2006.01)
*H02G 3/08* (2006.01)
*H02G 3/16* (2006.01)
*H05K 7/20* (2006.01)

(58) Field of Classification Search
CPC ........ H05K 7/20; H05K 5/0052; H05K 5/063; B60R 16/02; B60R 16/0238
USPC ..... 174/50, 66, 67, 17 R, 59, 559, 560, 561; 439/76.1, 76.2, 949, 535, 536
See application file for complete search history.

(56) References Cited

U.S. PATENT DOCUMENTS

| | | | | |
|---|---|---|---|---|
| 8,492,651 | B2* | 7/2013 | Schindler | H05K 5/061 |
| | | | | 439/535 |
| 8,633,383 | B2* | 1/2014 | Akahori | H01R 9/2458 |
| | | | | 174/559 |
| 8,941,009 | B2* | 1/2015 | Makino | B60R 16/0238 |
| | | | | 174/59 |
| 9,831,647 | B2* | 11/2017 | Kakoi | H05K 7/1401 |

FOREIGN PATENT DOCUMENTS

| JP | H11-307954 A | 11/1999 |
|---|---|---|
| JP | 2012-235654 A | 11/2012 |

\* cited by examiner

ELECTRICAL CONNECTION BOX

CROSS REFERENCE TO RELATED APPLICATIONS

This application is a national phase of PCT application No. PCT/JP2019/014696, filed on 2 Apr. 2019, which claims priority from Japanese patent application No. 2018-111304, filed on 11 Jun. 2018, all of which are incorporated herein by reference.

TECHNICAL FIELD

The present disclosure relates to an electrical connection box to be mounted in an automobile or the like, and in particular relates to an electrical connection box including a lock mechanism for detachably mounting a cover member on a box main body.

BACKGROUND

Conventionally, electrical connection boxes such as relay boxes, fuse boxes, and junction boxes have been used in electric systems of automobiles, and streamlining of electrical wiring and an increase in maintainability, such as exchanging of electrical wiring, are achieved by arranging multiple electrical components such as relays and fuses in a concentrated manner in the electrical connection box.

PRIOR ART DOCUMENT

Patent Document

Patent Document 1: JP H11-307954A
Patent Document 2: JP 2012-235654A

SUMMARY OF THE INVENTION

Problems to be Solved

Incidentally, as disclosed in Japanese Patent Laid-Open Publication No. H11-307954 (Patent Document 1), Japanese Patent Laid-Open Publication No. 2012-235654 (Patent Document 2), and the like, an electrical connection box includes a box main body that accommodates an internal circuit constituted by bus bars, a printed circuit board, and the like. An upper surface, which is a surface of the box main body, is provided with multiple component mounting portions in which electrical components are to be mounted, and the upper surface of the box main body is covered by a cover member that is detachably mounted on and fixed to the box main body via a lock mechanism. Here, the lock mechanism includes an elastic lock portion that is provided protruding in a cantilever shape on the cover member, and a locked portion that is provided on the box main body. When the cover member is to be mounted on the box main body, the elastic lock portion is allowed to enter the locked portion due to elastic lock portion engaging with the locked portion and elastically deforming, and due to the elastic lock portion going past the locked portion and elastically returning, the elastic lock portion engages with the locked portion and the cover member and the box main body are held in an attached state.

However, due to the fact that the number of heat generating components, such as fuses and relays, increases accompanying the recent increase in the number of automobile electronic components, and the size of the electrical connection box has been limited based on the spatial relationship of the installation location, the concentration of heat-generating components in the electrical connection box has also increased. In particular, the heat generation amount of fusible portions of fuses and coil portions of relays is extremely large. For this reason, heat is likely to be trapped in the hermetically-sealed electrical connection box and local overheating occurs, and thus there has been a risk of harming the function of the fuses and the relays.

In view of this, it is conceivable to promote heat dissipation from the cover member to the outside and prevent heat from being trapped in the electrical connection box by changing the cover member covering the upper surface of the box main body to a resin member with good thermal conductivity. However, due to the fact that a resin member with good thermal conductivity lacks flexibility, there has been a risk that when the cover member is detachably mounted on and fixed to the box main body via the lock mechanism, the elastic lock portion cannot bend sufficiently and thus will break.

In view of this, an object of the present disclosure is to provide an electrical connection box with a new structure according to which it is possible to improve the heat dissipation property of the electrical connection box while maintaining the durability of the lock mechanism.

Means to Solve the Problem

The electrical connection box of the present disclosure is an electrical connection box including: a box main body having one surface on which a plurality of component mounting portions in which electrical components are to be mounted are provided; a cover member for covering the one surface of the box main body; and a lock mechanism including a locked portion provided on a peripheral wall portion of the box main body and an elastic lock portion provided in a cantilever shape on the cover member, in which a top wall portion of the cover member is made of a resin material with a greater thermal conductivity than the elastic lock portion provided on a peripheral wall portion of the cover member, and the elastic lock portion provided on the peripheral wall portion of the cover member is made of a resin material with a greater elasticity than the top wall portion of the cover member.

Effect of the Invention

According to the present disclosure, it is possible to reduce or prevent a case in which heat is trapped in the electrical connection box by promoting heat dissipation from the cover member to the outside. Also, it is possible to reduce or eliminate the risk that the elastic lock portion will break when the cover member is detachably mounted on and fixed to the box main body via the lock mechanism, and it is possible to achieve an improvement in the heat dissipation property of the electrical connection box.

DETAILED DESCRIPTION TO EXECUTE THE INVENTION

Embodiment of the Present Disclosure

Figure 1:
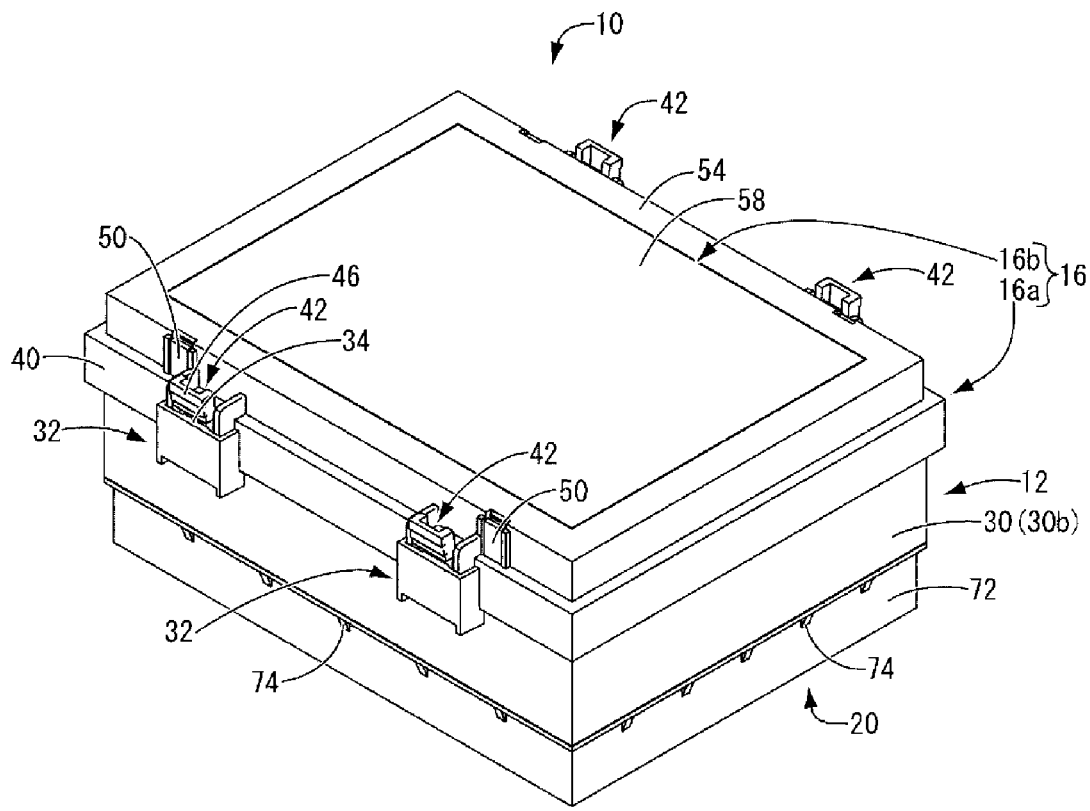
FIG. 1 is an overall perspective view showing an electrical connection box according to a first embodiment.

First, embodiments of the present disclosure will be listed and described.

An electrical connection box of the present disclosure is (1) an electrical connection box including: a box main body having one surface on which a plurality of component mounting portions in which electrical components are to be mounted are provided; a cover member for covering the one surface of the box main body; and a lock mechanism including a locked portion provided on a peripheral wall portion of the box main body and an elastic lock portion provided in a cantilever shape on the cover member, in which a top wall portion of the cover member is made of a resin material with a greater thermal conductivity than the elastic lock portion provided on a peripheral wall portion of the cover member, and the elastic lock portion provided on the peripheral wall portion of the cover member is made of a resin material with a greater elasticity than the top wall portion of the cover member.

According to the electrical connection box of the present disclosure, the top wall portion of the cover member is made of a resin material with a greater thermal conductivity than the elastic lock portion provided on the peripheral wall portion of the cover member. Accordingly, it is possible to reduce or prevent a case in which heat is trapped in the electrical connection box by promoting heat dissipation from the cover member to the outside. Also, the elastic lock portion is made of a resin material with a greater elasticity than the top wall portion. Accordingly, sufficient bending deformation of the elastic lock portion is ensured when the cover member is detachably mounted on and locked to the box main body via the lock mechanism, and thus it is possible to reduce or eliminate the risk that the elastic lock portion will break. For this reason, it is possible to achieve an improvement in the heat dissipation property of the electrical connection box while maintaining the durability of the lock mechanism.

Note that in the cover member, the top wall portion and the elastic lock portion may also be made of different resin materials using two-color molding, and the top wall portion and the elastic lock portion may also be attached to each other after being molded separately using different resin materials.

(2) It is preferable that the cover member includes a frame body peripheral wall portion on which the elastic lock portion is integrally provided and the top wall portion that is formed separately from the frame body peripheral wall portion and is detachably attached and fixed to the frame body peripheral wall portion, and the entire frame body peripheral wall portion is made of a resin material with a greater elasticity than the top wall portion.

The cover member includes the frame body peripheral wall portion on which the elastic lock portion is provided integrally, and the top wall portion that is formed separately from the frame body peripheral wall portion and is detachably attached and fixed to the frame body peripheral wall portion. Accordingly, it is easier to form the frame body peripheral wall portion and the top wall portion with separate materials that can exhibit respective required properties, and it is possible to achieve an improvement in the efficiency of manufacturing compared to two-color molding or the like.

In addition, the top wall portion is detachably attached and fixed to the frame body peripheral wall portion. For this reason, it is possible to easily realize a configuration according to which it is possible to improve heat dissipation of the electrical connection box while maintaining the durability of the lock mechanism. Furthermore, even if a defect occurs in the frame body peripheral wall portion or the top wall portion, the frame body peripheral wall portion or the top wall portion need only be exchanged. As a result, it is possible to achieve an improvement in maintainability as well.

(3) It is preferable that the top wall portion is attached and fixed by being inserted into the frame body peripheral wall portion from a lower-side opening portion of the frame body peripheral wall portion that opposes the box main body side, an inner flange is provided protruding on an upper-side opening portion of the frame body peripheral wall portion that is spaced apart from the box main body, and an insertion end of the top wall portion is defined due to an outer peripheral edge portion of the top wall portion overlapping with the inner flange, a lock piece that can perform bending deformation outward in a plate thickness direction is provided on the frame body peripheral wall portion, insertion of the top wall portion into the frame body peripheral wall portion is allowed due to the lock piece performing bending deformation outward upon abutting on a lock protruding portion provided protruding on a peripheral wall of the top wall portion, and due to the lock piece going past the lock protruding portion and elastically returning, the lock piece and the lock protruding portion engage with each other and the top wall portion is held in the frame body peripheral wall portion, and a water entrance prevention wall that is located on an outer periphery side with respect to an abutting surface abutting on the box main body and protrudes downward is provided protruding on a lower-side opening portion of the peripheral wall of the top wall portion.

The top wall portion is attached by being inserted from below the frame body peripheral wall portion, and the top wall portion abuts on the inner flange provided protruding on the upper-side opening portion of the frame body peripheral wall portion. Accordingly, the insertion end is defined. Furthermore, the lock mechanism is provided on the overlapping surfaces of the peripheral wall of the top wall portion and the frame body peripheral wall portion, and the top wall portion is held in a fixed state in the frame body peripheral wall portion. Here, a lock piece included in the lock mechanism is provided on the frame body peripheral wall portion, and a lock protrusion is provided on the top wall portion. For this reason, there is no need to provide a slit or the like that enables the lock piece to perform a bending deformation on the top wall portion located in the interior with respect to the frame body peripheral wall portion, and it is possible to provide a lock mechanism while ensuring a waterproofing property.

Furthermore, the water entrance prevention wall that is located in the outer periphery with respect to the surface abutting on the box main body and protrudes downward is provided protruding on the lower-side opening portion of the peripheral wall of the top wall portion. Accordingly, even if the top wall portion is exposed to water and water enters between the top wall portion and the frame body peripheral wall portion, it is possible to reliably prevent the water from entering the interior of the box main body with the water entrance prevention wall. For this reason, the waterproofing property of the cover member with the dual split structure can be more advantageously ensured.

(4) It is preferable that the peripheral wall portion of the box main body has a double-wall structure including an inner peripheral wall portion that abuts on and holds the abutting surface of the top wall portion that abuts on the box main body, and an outer peripheral wall portion that abuts on and holds an abutting surface of the frame body peripheral wall portion that abuts on the box main body, and the water entrance prevention wall is inserted into a recessed groove provided between the inner peripheral wall portion and the outer peripheral wall portion.

The top wall portion and the frame body peripheral wall portion constituting the cover member abut on and are held by the inner peripheral wall portion and the outer peripheral wall portion constituting the peripheral wall portions of the box main body. Accordingly, the top wall portion and the frame body peripheral wall portion can be stably supported by the box main body, and thus it is possible to reduce the risk that an excessive external force will be applied to the lock piece and the lock piece will break, or the like.

Furthermore, the water entrance prevention wall provided on the peripheral wall of the top wall portion is inserted into a recessed groove provided between the inner peripheral wall portion and the outer peripheral wall portion of the box main body. Accordingly, the entrance path of the water into the interior of the box main body becomes longer and more complex, and thus the interior of the box main body is more reliably prevented from being exposed to water.

Detailed Description of Embodiment of the Present Disclosure

A specific example of the electrical connection box of the present disclosure will be described hereinafter with reference to the drawings. Note that the present disclosure is not limited to these examples, but is indicated by the scope of the claims, and all changes within the meanings and range of equivalency to the claims are intended to be encompassed therein.

Figure 2:
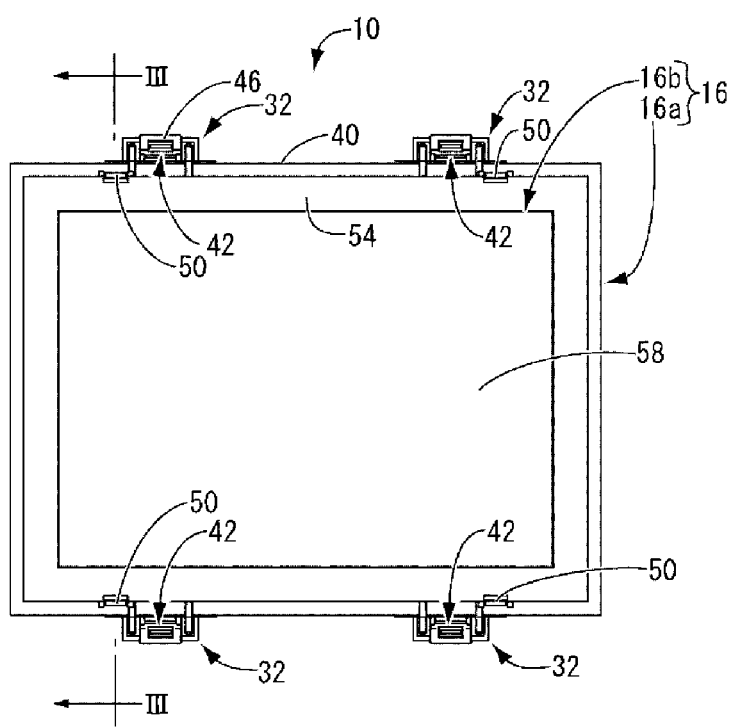
FIG. 2 is a plan view of the electrical connection box shown in FIG. 1.
Figure 3:
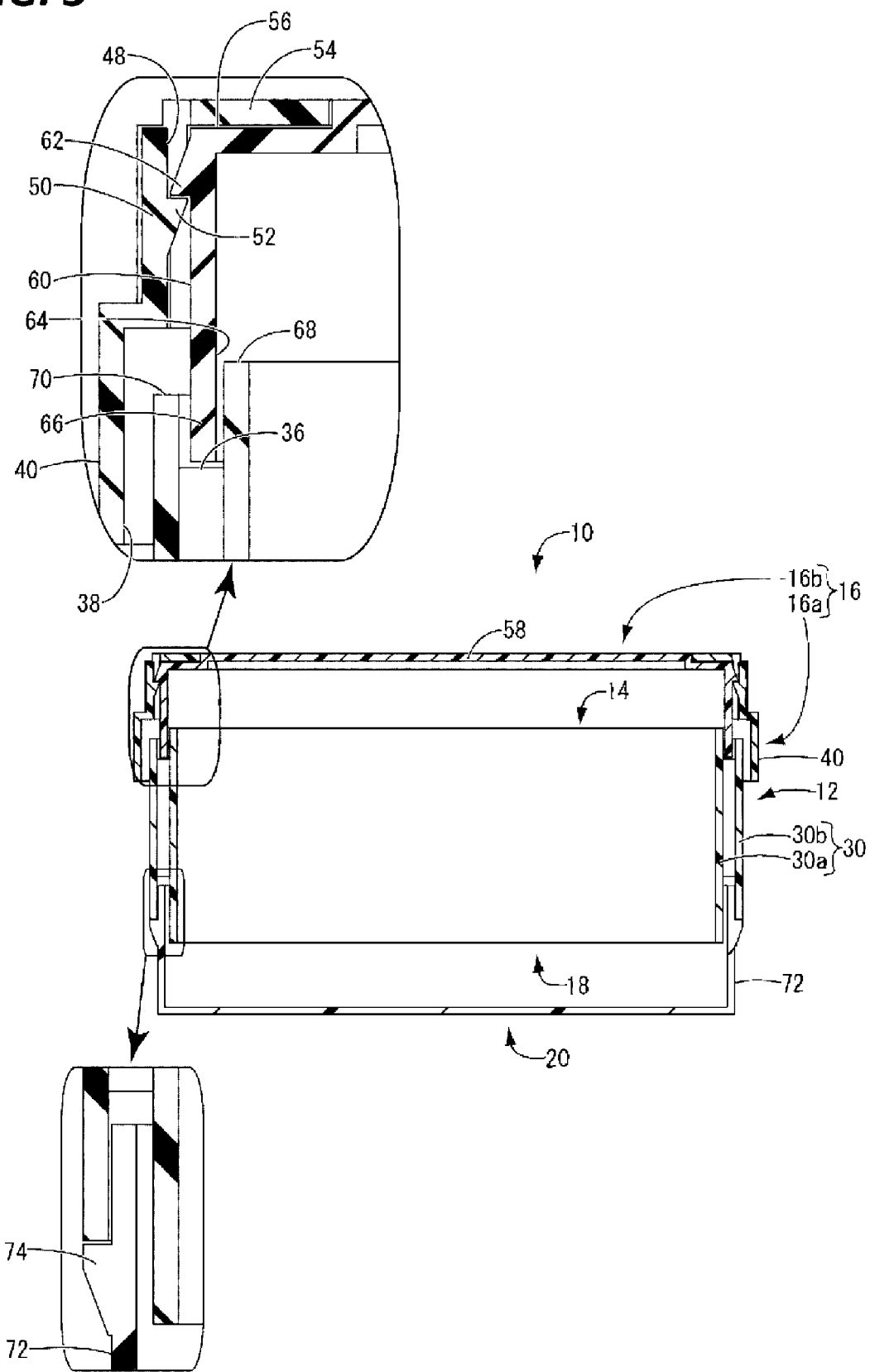
FIG. 3 is an enlarged view of a cross-section taken along line in FIG. 2.
Figure 4:
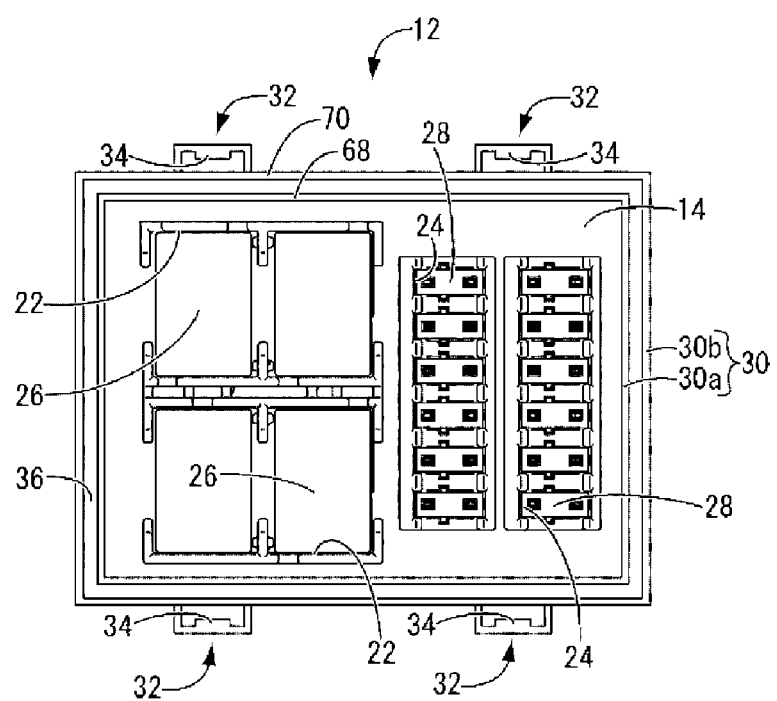
FIG. 4 is a plan view of a box main body shown in FIG. 1.

FIGS. 1 to 5 show an electrical connection box 10 serving as a first embodiment of the present disclosure. As shown in FIGS. 1, 3, and 4, the electrical connection box 10 is constituted by including a box main body 12, an upper cover 16, which is a cover member for covering an upper surface 14, which is one surface of the box main body 12, and a lower cover 20 for covering a lower surface 18, which is another surface of the box main body 12. Note that in the following description, "upper" refers to the upper side in FIGS. 1, 3, and 5, "lower" refers to the lower side in FIGS. 1, 3, and 5, "frontward" refers to the right side in FIGS. 2 to 4, "rearward" refers to the left side in FIGS. 2 to 4, "longitudinal direction" refers to the left-right direction in FIGS. 2 to 4, and "width direction" refers to the up-down direction in FIGS. 2 and 4.

As shown in FIG. 1, the box main body 12 has an elongated rectangular block shape overall, and for example, is formed integrally through injection molding or the like using an insulating synthetic resin such as polypropylene (PP) or polyamide (PA). As shown in FIG. 4, multiple relay mounting portions 22 and fuse mounting portions 24 that form component mounting portions are provided opening upward in the upper surface 14 of the box main body 12. Multiple terminal accommodation holes and bus bar accommodation grooves are formed opening downward in the lower surface 18 (see FIG. 3) of the box main body 12, and crimping terminals that are crimped to the terminals of wires and bus bars are accommodated and arranged in the terminal accommodation holes and bus bar accommodation grooves, although this is not shown in the drawings.

Starting from the upper surface 14 side of the box main body 12, relays 26 and fuses 28, which are electrical components, are mounted in the relay mounting portions 22 and the fuse mounting portions 24. Accordingly, tab terminals (not shown) that protrude downward from the relays 26 and the fuses 28 are electrically connected to crimping terminals, bus bars, and the like of the terminals of the above-described wires. Note that in order to facilitate understanding, in FIG. 3, illustration of the relay mounting portions 22 and the fuse mounting portions 24 that constitute the component mounting portions, and the relays 26 and the fuses 28, which are electrical components, is omitted.

Also, as shown in FIGS. 1, 2, and 4, engagement frames 32, which are locked portions constituting approximately U-shaped lock mechanisms in a plan view, are provided protruding outward (in FIG. 4, in the up-down direction) at a total of four locations that are arranged separate from each other and oppose each other in the width direction, near the upper end portion of a peripheral wall portion 30 of the box main body 12. More specifically, the engagement frames 32 each have a structure in which both end portions are joined to the peripheral wall portion 30 and are provided in a protruding manner (see FIG. 4). As shown in FIG. 1, the engagement frames 32 are each configured such that a portion thereof protrudes toward the upper cover 16, that is, upward in the vertical direction, past the upper end portion of the peripheral wall portion 30. Also, engaging protrusions 34 that protrude inward are provided on the upper end portions of the engagement frames 32 (see FIG. 4).

In addition, as shown in FIGS. 3 and 4, the peripheral wall portion 30 of the box main body 12 has a double wall structure including an inner peripheral wall portion 30a provided on the inner peripheral side, and an outer peripheral wall portion 30b provided on the outer peripheral side. A recessed groove 36 that opens upward and extends along a peripheral wall portion 30 in an approximately rectangular cross-sectional shape is provided on the upper end portion between the inner peripheral wall portion 30a and the outer peripheral wall portion 30b.

Figure 5:
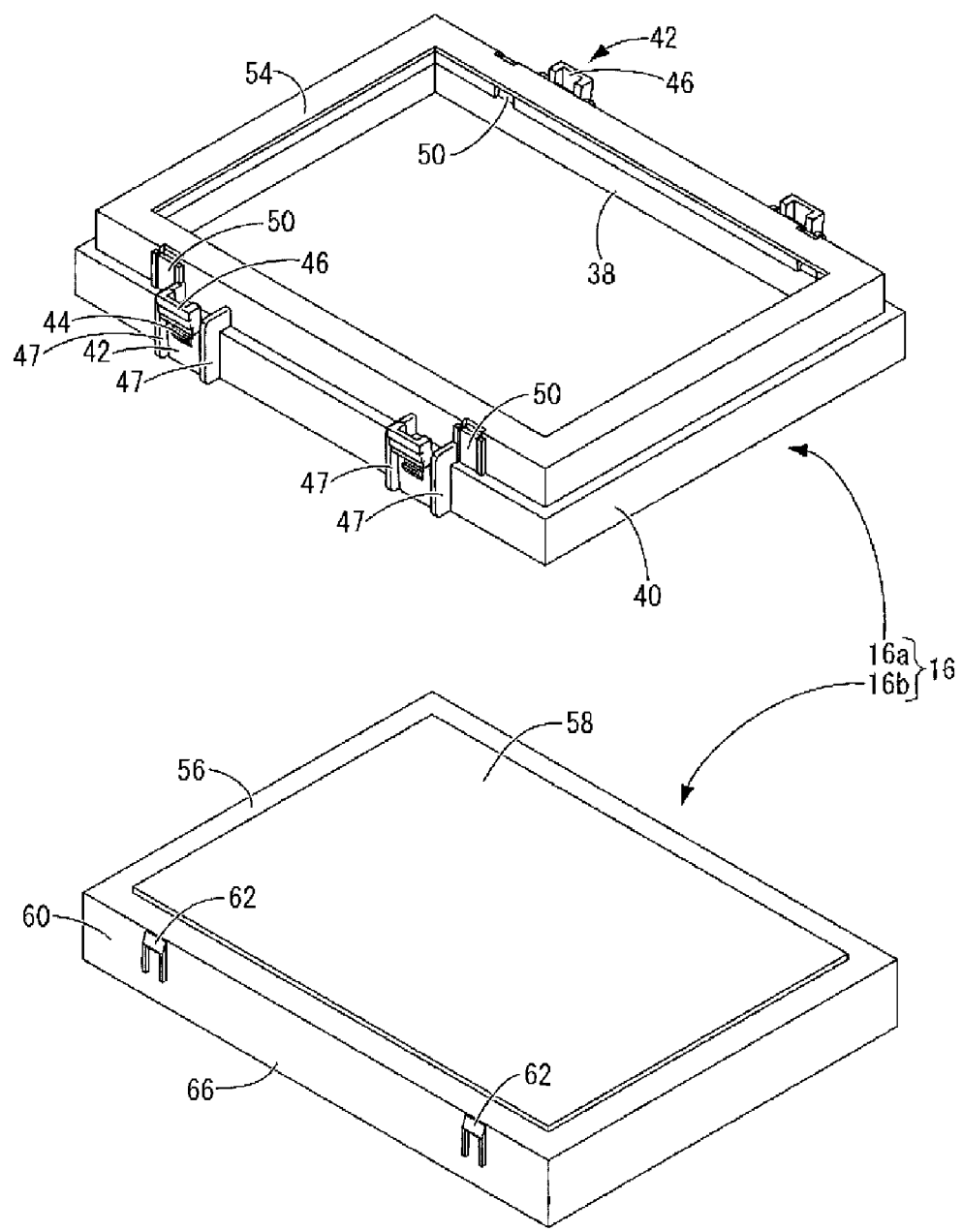
FIG. 5 is an exploded perspective view of a cover member shown in FIG. 1.

As shown in FIGS. 1, 3, and 5, the upper cover 16 has an approximately rectangular box shape that opens downward overall. More specifically, the upper cover 16 is constituted by including a frame body peripheral wall portion 16a that forms the peripheral wall portion of the upper cover 16, opens downward, and has an approximately rectangular frame body shape in a plan view, and a top wall portion 16b that opens downward and has an approximately rectangular box shape. Elastic lock portions 42 that form lock mechanisms are provided coupled to a lower-side opening portion 38 and extending in cantilever shapes obliquely outward and upward at a total of four locations that are arranged separate from each other in the longitudinal direction and oppose each other in the width direction on the outer peripheral surface 40 near the lower-side opening portion 38 of the frame body peripheral wall portion 16a that opposes the box main body 12 side. Lock protruding portions 44 that protrude outward in approximately triangular cross-sectional shapes at approximately central portions in the extension direction are provided on the elastic lock portions 42. Also, unlocking portions 46 that protrude outward in approximate U shapes in a plan view at the extension tip end portions are provided on the elastic lock portions 42. Note that a pair of guide portions 47 are provided protruding on both sides in the width direction of each elastic lock portion 42, and thus the elastic lock portions 42 are positioned with respect to the engagement frame 32. Also, lock pieces 50 that are approximately rectangular plane-shaped are provided at a total of four locations that are arranged separate from each other in the longitudinal direction and oppose each other in the width direction, near the upper-side opening portion 48 of the frame body peripheral wall portion 16a that is spaced apart from the box main body 12 side. Both sides in the width direction and the upper side of the lock pieces 50 are cut out by slits (not shown), and the lock pieces 50 are coupled to the frame body peripheral wall portion 16a in a cantilever shape on the lower side, and can perform a bending transformation outward in the thickness direction (the left-right direction in FIG. 3). Furthermore, lock protruding portions 52 that protrude inward in a shape that is an approximately triangular cross-sectional shape at the approximate centers in the extension direction are provided on the lock pieces 50 (see FIG. 3). In addition, inner flanges 54 with approximately rectangular frame shapes that protrude inward are provided on the upper-side opening portion 48 of the frame body peripheral wall portion 16a that is spaced apart from the box main body 12.

The top wall portion 16b has an approximately rectangular box body shape that opens downward overall, and the main portion in the center of the top surface 56 protrudes in an approximately rectangular shape in a plan view to form a protruding portion 58. Also, lock protruding portions 62 that protrude outward in approximately triangular cross-sectional shapes are provided at a total of four locations that are arranged separate from each other in the longitudinal direction of the peripheral wall 60 and oppose each other in the width direction are provided on the upper end portion of the peripheral wall 60 of the top surface 56. Furthermore, a water entrance prevention wall 66 (see FIG. 3) that protrudes downward is provided on a lower-side opening portion 64 of the peripheral wall 60 of the top wall portion 16b.

The top wall portion 16b included in the upper cover 16 is integrally formed through injection molding or the like using a resin material with a greater thermal conductivity than the frame body peripheral wall portion 16a included in the peripheral wall portion of the upper cover 16, on which the elastic lock portions 42 are provided, for example, an insulating synthetic resin such as polyphenylene sulfide (PPS) and polybutylene terephthalate (PBT). Also, the frame body peripheral wall portion 16a on which the elastic lock portions 42 are provided is formed integrally through injection molding or the like using a resin material with a larger elasticity than the top wall portion 16b, for example, an insulating synthetic resin such as polypropylene (PP). That is, the top wall portion 16b and the frame body peripheral wall portion 16a constituting the upper cover 16 are individually molded integrally using different resin materials.

The task of attaching and fixing the upper cover 16 configured in this manner is executed by inserting the top wall portion 16b into the frame body peripheral wall portion 16a from the lower-side opening portion 38 of the frame body peripheral wall portion 16a that opposes the box main body 12 side. More specifically, by inserting the top wall portion 16b from below the frame body peripheral wall portion 16a, the lock protruding portions 62 that are provided protruding on the peripheral wall 60 of the top wall portion 16b abut on the lock protruding portions 52 of the lock pieces 50 of the frame body peripheral wall portion 16a, which can perform a bending deformation outward in the plate thickness direction. Due to the lock protruding portions 62 causing the lock pieces 50 to bend and deform outward, further insertion of the top wall portion 16b into the frame body peripheral wall portion 16a is allowed (see FIG. 3). Next, when the top wall portion 16b is inserted further, the lock protruding portions 62 of the top wall portion 16b goes past the lock protruding portions 52 of the lock pieces 50 and elastically return. Accordingly, the lock protruding portions 52 of the lock pieces 50 of the frame body peripheral wall portion 16a and the lock protruding portions 62 of the top wall portion 16b engage with each other. Due to the outer peripheral edge portion including the peripheral wall 60 of the top wall portion 16b overlapping with the inner flange 54, further insertion of the top wall portion 16b is restricted, and the insertion end of the top wall portion 16b is defined. As a result, the top wall portion 16b is held in a state of being attached to the frame body peripheral wall portion 16a, and thus the upper cover 16 is formed.

In the upper cover 16 in the attached state, the protruding portion 58 that is provided protruding on the top surface 56 of the top wall portion 16b covers the upper opening portion of the frame body peripheral wall portion 16a surrounded by the protruding tip portion of the inner flange 54 from below. Accordingly, the upper surface of the upper cover 16 is approximately flat. Also, in the upper cover 16 in the attached state, the lock pieces 50 of the frame body peripheral wall portion 16a can be bent outward to remove the engagement between the lock protruding portions 52 and the lock protruding portions 62 of the top wall portion 16b. This makes it possible to detachably attach and fix the top wall portion 16b to the frame body peripheral wall portion 16a. In addition, as shown in FIG. 3, in the upper cover 16 in the attached state, an inner peripheral wall portion 30a of the peripheral wall portion 30 of the box main body 12 abuts on and holds an abutting surface 68 of the top wall portion 16b that abuts on the box main body 12. Accordingly, an outer peripheral wall portion 30b abuts on and holds an abutting surface 70 of the frame body peripheral wall portion 16a that abuts on the body main body 12. Accordingly, due to the fact that the top wall portion 16b and the frame body peripheral wall portion 16a can be stably supported by the box main body 12, it is possible to reduce the risk that the lock pieces 50 of the frame body peripheral wall portion 16a will deform excessively and break. Also, the water entrance prevention wall 66 that protrudes downward from the lower-side opening portion 64 of the peripheral wall 60 of the top wall portion 16b is inserted into the recessed groove 36 provided between the inner peripheral wall portion 30a and the outer peripheral wall portion 30b. Here, due to the fact that the water entrance prevention wall 66 is located toward the outer periphery with respect to the abutting surface 68 abutting on the box main surface 12 and protrudes downward, the path by which water enters the interior of the box main body 12 is longer and more complex, and thus the interior of the box main body 12 is more reliably prevented from being exposed to water.

When the upper cover 16 configured in this manner is attached so as to cover the upper surface 14 of the box main body 12, as shown in FIG. 3, the water entrance prevention wall 66 that protrudes from the top wall portion 16b of the upper cover 16 is pressed from above so as to enter the recessed groove 36 provided between the inner peripheral wall portion 30a and the outer peripheral wall portion 30b forming the peripheral wall portion 30 of the box main body 12. Accordingly, the elastic lock portions 42 positioned by the guide portions 47 that are provided protruding on the frame body peripheral wall portion 16a of the upper cover 16 are inserted into the engagement frames 32 provided protruding near the upper end portion of the peripheral wall portion 30 of the box main body 12. Next, due to the engagement protrusions 34 of the engagement frames 32 abutting on the lock protruding portions 44 of the elastic lock portions 42 and bending and deforming the elastic lock portions 42 inward, further pressing of the upper cover 16 on the box main body 12 is allowed. When the upper cover 16 is further pressed downward, the engagement protrusions 34 of the box main body 12 go past the lock protruding portions 44 of the elastic lock portions 42 and elastically return. Accordingly, the engagement protrusions 34 of the box main body 12 and the lock protruding portions 44 of the upper cover 16 engage with each other. As a result, the upper cover 16 is attached to and held by the box main body 12, whereby the electrical connection box 10 is formed. Note that in the electrical connection box 10 in the attached state, the engagement between the engagement protrusions 34 of the box main body 12 and the lock protruding portions 44 of the upper cover 16 can be removed by pressing the unlocking portions 46 of the elastic lock portions 42 of the upper cover 16 inward. As a result, the upper cover 16 can be detachably attached to the box main body 12.

The lower cover 20 is an integrally molded object made of a synthetic resin, and as shown in FIGS. 1 and 3, has an approximate box shape that opens upward. Also, many support protrusions 74 that are spaced apart in the outer periphery, protrude outward in a shape with an approximately triangular cross-section, and support the outer peripheral wall portion 30b of the peripheral wall portion 30 of the box main body 12 are provided at the central portion in the up-down direction of the peripheral wall 72 of the lower cover 20. Note that the lower cover 20 is locked and fixed to the box main body 12 using the lock mechanism (not shown).

According to the electrical connection box 10 with this configuration, the top wall portion 16b included in the outer cover 16 is made of a resin material with a greater thermal conductivity than the frame body peripheral wall portion 16a on which the elastic lock portions 42 are provided. This makes it possible to reduce or prevent a case in which heat is trapped in the electrical connection box 10 by promoting heat dissipation from the outer cover 16 to the outside. Also, the frame body peripheral wall portion 16a is made of a resin material with a greater elasticity than the top wall portion 16b. As a result, sufficient bending deformation is ensured in the elastic lock portions 42 formed on the frame body peripheral wall portion 16a. For this reason, it is possible to reduce or eliminate the risk that the elastic lock portions 42 will break. Due to the above, it is possible to achieve an improvement in the heat dissipation property of the electrical connection box 10 while maintaining the durability of the lock mechanisms 32 and 42.

Moreover, in the present embodiment, due to the fact that the top wall portion 16b and the frame body peripheral wall portion 16a constituting the upper cover 16 are molded separately, it is possible to achieve an improvement in the manufacturing efficiency compared to the case where, for example, the top wall portion 16b and the frame body peripheral wall portion 16a are formed integrally through two-color molding or the like. In addition, even if a defect occurs in the frame body peripheral wall portion 16a or the top wall portion 16b, the frame body peripheral wall portion 16a or the top wall portion 16b need only be exchanged, and therefore it is possible to achieve an improvement in maintainability as well.

Also, the water entrance prevention wall 66 that is provided toward the outer periphery with respect to the abutting surface 68 abutting on the box main body 12 and protrudes downward is provided protruding on the lower-side opening portion 64 of the peripheral wall 60 of the top wall portion 16b. For this reason, even if the top wall portion 16b is exposed to water and the water enters between the top wall portion 16b and the frame body peripheral wall portion 16a, it is possible to reliably prevent the water from entering the box main body 12 with the water entrance prevention wall 66. This makes it possible to more advantageously ensure the waterproof property when using a configuration in which the upper cover 16 is divided into the top wall portion 16b and the frame body peripheral wall portion 16a.

<Other>

Although a first embodiment was described in detail above as a specific example of the present disclosure, the present disclosure is not limited by this specific description. Modifications, improvements, and the like within a range in which the object of the present disclosure can be achieved are included in the present disclosure. For example, the following embodiment is also included in the technical scope of the present disclosure.

(1) In the above-described embodiment, the top wall portion 16b and the frame body peripheral wall portion 16a constituting the upper cover 16 were molded separately, but they may also be formed integrally using different materials, and using a known technique such as two-color molding. Due to being formed integrally, it is no longer necessary to assemble the upper cover 16, and thus workability can be improved. Note that if the upper cover 16 is formed integrally, the region corresponding to at least the top wall portion 16b need only be made of a resin material with a greater thermal conductivity than the elastic lock portions 42, and at least the elastic lock portions 42 need only be formed with a resin material with a greater elasticity than the region corresponding to the top wall portion 16b.

LIST OF REFERENCE NUMERALS

10 Electrical connection box
12 Box main body
14 Upper surface (one surface)
16 Upper cover (cover member)
16a Frame body peripheral wall portion (peripheral wall portion)
16b Top wall portion
22 Relay mounting portion (component mounting portion)
24 Fuse mounting portion (component mounting portion)
26 Relay (electrical component)
28 Fuse (electrical component)
30 Peripheral wall portion
30a Inner peripheral wall portion
30b Outer peripheral wall portion
32 Engagement frame (locked portion) (lock mechanism)
36 Recessed groove
38 Lower-side opening portion
42 Elastic lock portion (lock mechanism)
48 Upper-side opening portion
50 Lock piece
54 Inner flange
60 Peripheral wall
62 Lock protruding portion
64 Lower-side opening portion
66 Water entrance prevention wall
68 Abutting surface
70 Abutting surface

What is claimed is:

1. An electrical connection box comprising:
a box main body having one surface on which a plurality of component mounting portions in which electrical components are to be mounted are provided;
a cover member for covering the one surface of the box main body; and
a lock mechanism including a locked portion provided on a peripheral wall portion of the box main body and an elastic lock portion provided in a cantilever shape on the cover member,
wherein the cover member includes a frame body peripheral wall portion on which the elastic lock portion is integrally provided and the top wall portion that is formed separately from the frame body peripheral wall portion and is detachably attached and fixed to the frame body peripheral wall portion, and
wherein the top wall portion of the cover member is made of a resin material with a greater thermal conductivity than the elastic lock portion provided on the frame body peripheral wall portion of the cover member, and the elastic lock portion provided on the frame body peripheral wall portion of the cover member is made of a resin material with a greater elasticity than the top wall portion of the cover member.

2. The electrical connection box according to claim 1, wherein the entire frame body peripheral wall portion is made of a resin material with a greater elasticity than the top wall portion.

3. The electrical connection box according to claim 1, wherein
the top wall portion is attached and fixed by being inserted into the frame body peripheral wall portion from a lower-side opening portion of the frame body peripheral wall portion that opposes the box main body side,
an inner flange is provided protruding on an upper-side opening portion of the frame body peripheral wall portion that is spaced apart from the box main body, and an insertion end of the top wall portion is defined due to an outer peripheral edge portion of the top wall portion overlapping with the inner flange,
a lock piece that can perform bending deformation outward in a plate thickness direction is provided on the frame body peripheral wall portion, insertion of the top wall portion into the frame body peripheral wall portion is allowed due to the lock piece performing bending deformation outward upon abutting on a lock protruding portion provided protruding on a peripheral wall of the top wall portion, and due to the lock piece going past the lock protruding portion and elastically returning, the lock piece and the lock protruding portion engage with each other and the top wall portion is held in the frame body peripheral wall portion, and
a water entrance prevention wall that is located on an outer periphery side with respect to an abutting surface abutting on the box main body and protrudes downward is provided protruding on a lower-side opening portion of the peripheral wall of the top wall portion.

4. The electrical connection box according to claim 3, wherein
the peripheral wall portion of the box main body has a double-wall structure including an inner peripheral wall portion that abuts on and holds the abutting surface of the top wall portion that abuts on the box main body, and an outer peripheral wall portion that abuts on and holds an abutting surface of the frame body peripheral wall portion that abuts on the box main body, and the water entrance prevention wall is inserted into a recessed groove provided between the inner peripheral wall portion and the outer peripheral wall portion.

* * * * *